United States Patent
Wu et al.

(10) Patent No.: US 10,797,166 B2
(45) Date of Patent: Oct. 6, 2020

(54) MANUFACTURING METHOD FOR IGZO ACTIVE LAYER AND OXIDE THIN FILM TRANSISTOR

(71) Applicant: SHENZHEN CHINA STAR OPTOELECTRONICS SEMICONDUCTOR DISPLAY TECHNOLOGY CO., LTD., Shenzhen, Guangdong (CN)

(72) Inventors: Yue Wu, Guangdong (CN); Wei Wu, Guangdong (CN)

(73) Assignee: SHENZHEN CHINA STAR OPTOELECTRONICS SEMICONDUCTOR DISPLAY TECHNOLOGY CO., LTD., Shenzhen, Guangdong (CN)

( * ) Notice: Subject to any disclaimer, the term of this patent is extended or adjusted under 35 U.S.C. 154(b) by 5 days.

(21) Appl. No.: 16/203,159

(22) Filed: Nov. 28, 2018

(65) Prior Publication Data

US 2019/0305116 A1 Oct. 3, 2019

Related U.S. Application Data

(63) Continuation of application No. PCT/CN2018/092358, filed on Jun. 22, 2018.

(30) Foreign Application Priority Data

Apr. 3, 2018 (CN) .......................... 2018 1 0298222

(51) Int. Cl.
| H01L 29/66 | (2006.01) |
| H01L 21/465 | (2006.01) |
| H01L 21/02 | (2006.01) |
| H01L 29/786 | (2006.01) |

(52) U.S. Cl.
CPC .. *H01L 29/66969* (2013.01); *H01L 21/02046* (2013.01); *H01L 21/465* (2013.01); *H01L 29/7869* (2013.01)

(58) Field of Classification Search
CPC ................................................... H01L 29/7869
See application file for complete search history.

(56) References Cited

U.S. PATENT DOCUMENTS

| 2008/0035920 A1* | 2/2008 | Takechi | ............ H01L 29/78618 257/43 |
| 2011/0070691 A1* | 3/2011 | Ye | ..................... H01L 29/78606 438/104 |

FOREIGN PATENT DOCUMENTS

| CN | 105448823 A | * 3/2016 |
| CN | 106057679 A | 10/2016 |

* cited by examiner

*Primary Examiner* — Alia Sabur
(74) *Attorney, Agent, or Firm* — Leong C. Lei

(57) ABSTRACT

A manufacturing method for an IGZO active layer is disclosed. The method comprises steps of: after depositing a first metal layer and a gate insulation layer on a substrate, depositing an IGZO material on the gate insulation layer, and forming an IGZO film; and performing a plasma cleaning treatment on a surface of the IGZO film by using an argon gas or a helium gas to adjust element contents on the surface of the IGZO film, and forming an IGZO active layer. The present invention also correspondingly discloses a manufacturing method for an oxide thin film transistor. By implementing the embodiments of the present invention, the elements on the film surface of the IGZO active layer can be adjusted to improve electrical properties.

6 Claims, 4 Drawing Sheets

MANUFACTURING METHOD FOR IGZO ACTIVE LAYER AND OXIDE THIN FILM TRANSISTOR

CROSS-REFERENCE TO RELATED APPLICATION

This application is a continuing application of PCT Patent Application No. PCT/CN2018/092358, entitled "MANUFACTURING METHOD FOR IGZO ACTIVE LAYER AND OXIDE THIN FILM TRANSISTOR", filed on Jun. 22, 2018, which claims priority to China Patent Application No. CN201810298222.4 filed on Apr. 3, 2018, both of which are hereby incorporated in its entireties by reference.

FIELD OF THE INVENTION

The present invention relates to a display technology field, and in particular to a manufacturing method for IGZO active layer and oxide thin film transistor.

BACKGROUND OF THE INVENTION

In the array substrate of a thin-film transistor liquid crystal display (TFT-LCD), for the metal oxide semiconductor layer in the TFT, an IGZO (indium gallium zinc oxide) material is widely used. The function of the three metal elements in the semiconductor is different. For example, the gallium can effectively stabilize oxygen and improve the controllability of IGZO-TFT. The indium can increase the carrier concentration and increase the TFT current, but correspondingly reduce the controllability.

FIG. 1 is a schematic structural view of a back channel etching (BCE) structure of an oxide thin film transistor (TFT) in the prior art, which includes a gate electrode 11', a gate insulation layer 12', an IGZO active layer 13', and a source and drain electrode 14' sequentially disposed on a glass substrate 1'. However, in the existing TFT preparation process, especially in the process of preparing the BCE structure of the TFT, since the source and drain electrodes 14' of the second metal layer are formed by wet etching, in order to ensure that there is no metal residue, usually in the second after the second metal layer is just etched (JE), a certain additional etching time (over etch, OE) is added, and the film surface of the IGZO active layer 13' is full contacted with the etching liquid during the additional etching time.

Since the etching solution used in the process is acidic, the pH value is generally 3-5, and the etching solution further contains hydrogen peroxide, so that after the IGZO active layer 2' passes through the etching solution, the contents of the indium (In), gallium (Ga), and zinc (Zn) on the surface are redistributed, and the content of the oxygen (O) content is increased.

Specifically, in the inspection of the back channel, it was found that the content of gallium and zinc in the back channel was greatly reduced, and the content of indium and oxygen was increased. For example, Table 1 below shows the results of comparison before and after the components in one embodiment.

TABLE 1

Percent change of each component before and after etching

| Peak | Blank sample atomic percentage | Atomic percentage of surface after etching solution |
|---|---|---|
| Ga 2p | 12.53 | 10.78 |
| Zn 2p | 14.77 | 7.82 |
| O 1s | 56.98 | 62.97 |
| In 3d | 15.72 | 18.42 |

Wherein, the blank sample is an IGZO film deposited by physical vapor deposition (PVD). After passing through the etching solution, the content percentage of Ga on the surface decreases from 12.53 to 10.78, the content percentage of Zn decreases from 14.77 to 7.82, and the content percentage of O increases from 56.98 to 62.97, the content percentage of In increases from 15.72 to 18.42, this change will affect the performance of IGZO film.

SUMMARY OF THE INVENTION

The technical problem solved by the present invention is to provide a manufacturing method for an IGZO active layer and an oxide thin film transistor, which can adjust elements on the film surface of the IGZO active layer and improve electrical properties thereof.

In order to solve the above technology problem, an embodiment of the present invention provides a manufacturing method for an IGZO active layer, comprising steps of: after depositing a first metal layer and a gate insulation layer on a substrate, depositing an IGZO material on the gate insulation layer, and forming an IGZO film; and performing a plasma cleaning treatment on a surface of the IGZO film by using an argon gas or a helium gas to adjust element contents on the surface of the IGZO film, and forming an IGZO active layer.

Wherein the step of performing a plasma cleaning treatment on a surface of the IGZO film by using an argon gas or a helium gas includes a step of: performing a plasma cleaning treatment to a film surface of the IGZO active layer using the argon gas or the helium gas; wherein a power adopted in the plasma cleaning is 1000~6000 watts; a gas pressure is 30~70 mTorr, and a gas flow rate is 200~2000 standard milliliter/min; and a processing time is 0~120 seconds.

Wherein the plasma cleaning treatment uses a power of 30004000 watts; a gas pressure of 30~50 mTorr; a gas flow rate of 500~1000 standard milliliter/min, and a processing time of 5~20 seconds.

Wherein the method further includes a step of: photoresist coating, exposing, developing, and etching the surface of the IGZO film after the plasma cleaning treatment in order to complete an IGZO patterning to form the IGZO active layer.

Correspondingly, the present invention further provides a manufacturing method for an oxide thin film transistor, comprising steps of: providing a substrate, and depositing a first metal layer on the substrate to form a gate electrode; depositing a gate insulation layer on the first metal layer; depositing an IGZO material on the gate insulation layer to form an IGZO film, and performing a plasma cleaning treatment on a surface of the IGZO film by using an argon gas or a helium gas to form an IGZO active layer; and depositing a second metal layer on the IGZO active layer and etching the second metal layer to form a gate electrode and a drain electrode.

Wherein the step of performing plasma cleaning treatment on a surface of the IGZO film by using an argon gas or a helium gas includes a step of: performing a plasma cleaning treatment to a film surface of the IGZO active layer using the argon gas or the helium gas, wherein a power adopted in the plasma cleaning treatment is 1000~6000 watts; a gas pressure is 30~70 mTorr, and the gas flow rate is 200~2000 standard milliliter/min; a processing time is 0~120 seconds.

Wherein the plasma cleaning treatment uses a power of 3000~4000 watts; a gas pressure of 30~50 mTorr; a gas flow rate of 500~1000 standard cc/min, and a processing time of 5~20 seconds.

Wherein the step of depositing an IGZO material on the gate insulation layer to form an IGZO film, and performing a plasma cleaning treatment on a surface of the IGZO film by using an argon gas or a helium gas to form an IGZO active layer comprises steps of: depositing an IGZO material on the gate insulation layer by physical vapor deposition to form the IGZO film; performing the plasma cleaning treatment to the surface of the IGZO film by the argon gas or the helium gas; and photoresist coating, exposing, developing, and etching the surface of the IGZO film after performing the plasma cleaning treatment to the IGZO film in order to complete an IGZO patterning to form the IGZO active layer.

Wherein the step of depositing an IGZO material on the gate insulation layer to form an IGZO film, and performing a plasma cleaning treatment on a surface of the IGZO film by using an argon gas or a helium gas to form an IGZO active layer comprises steps of: depositing an IGZO material on the gate insulation layer by physical vapor deposition to form the IGZO film; and performing the plasma cleaning treatment to the surface of the IGZO film by the argon gas or the helium gas in order to form the IGZO active layer.

Wherein the step of depositing a second metal layer on the IGZO active layer and etching the second metal layer to form a source electrode and a drain electrode comprises steps of: depositing a second metal layer on the IGZO active layer; coating a photoresist on the second metal layer; etching a peripheral of the second metal layer and the IGZO film; and thinning the photoresist, and through a wet etching to form the source electrode and the drain electrode on the second metal layer.

Embodiments of the present invention have the following beneficial effects:

The manufacturing method for an IGZO active layer and the manufacturing method for an oxide thin film transistor provided by the present invention, after forming an IGZO film, performing a plasma cleaning treatment on the surface of the IGZO film by using argon gas or helium gas such that the Ga content and the Zn content in the film surface of the IGZO active layer are increased, and the O content and the In content are decreased, thereby reducing the performance impact caused by the wet etching process for forming the source and drain electrodes.

BRIEF DESCRIPTION OF THE DRAWINGS

In order to more clearly illustrate the technical solution in the present invention or in the prior art, the following will illustrate the figures used for describing the embodiments or the prior art. It is obvious that the following figures are only some embodiments of the present invention. For the person of ordinary skill in the art without creative effort, it can also obtain other figures according to these figures.

DETAILED DESCRIPTION OF PREFERRED EMBODIMENTS

Figure 1:
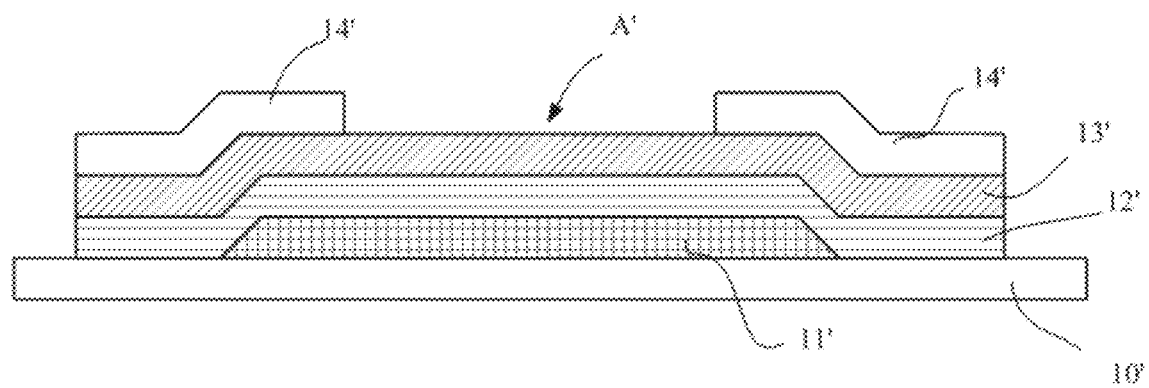
FIG. 1 is a schematic structural diagram of an oxide thin film transistor in the prior art.

The technical solutions in the embodiments of the present invention are clearly and completely described in conjunction with the accompanying drawings in the embodiments of the present invention. It is obvious that the described embodiments are only a part of the embodiments of the present invention, and not all of the embodiments. All other embodiments obtained by those skilled in the art based on the embodiments of the present invention without creative efforts are within the protection scope of the present invention.

Here, it should also be noted that in order to avoid obscuring the invention by unnecessary detail, only the structures and/or processing steps closely related to the solution according to the invention are shown in the drawings, and the other details that are not relevant to the present invention are omitted.

Figure 2:
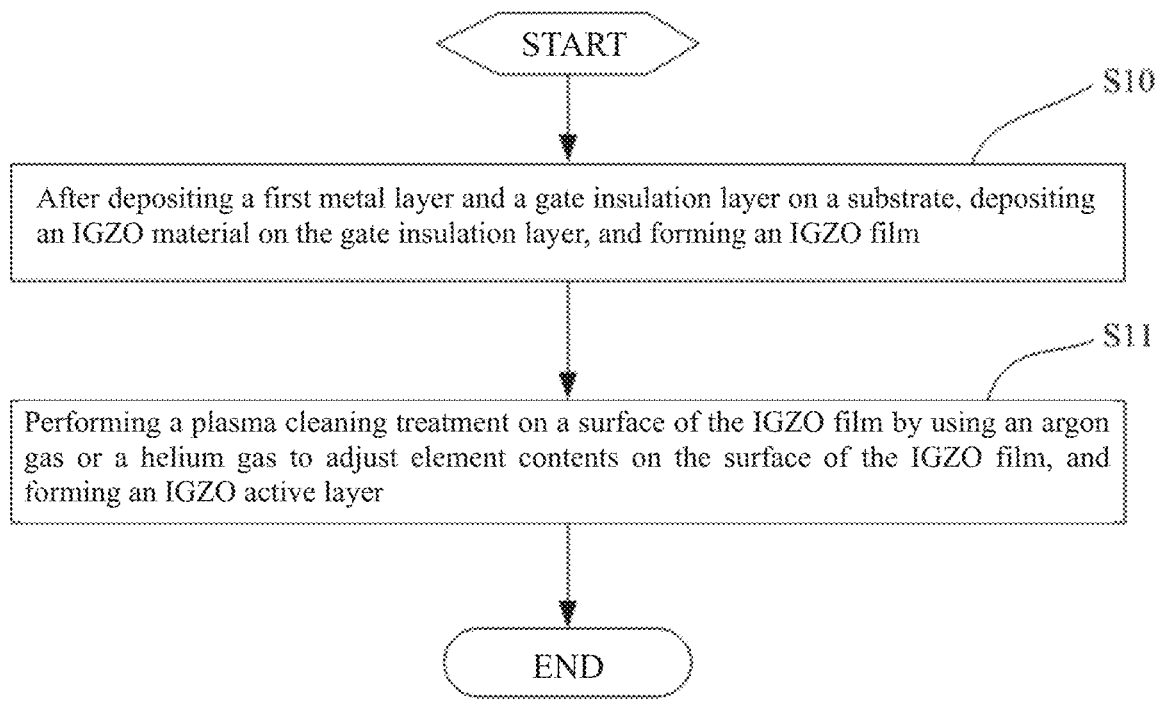
FIG. 2 is a schematic diagram of a main flow of a manufacturing method for an IGZO active layer provided by an embodiment of the present invention.

FIG. 2 is a schematic diagram of a main flow of manufacturing method for an IGZO active layer provided by an embodiment of the present invention; in this embodiment, the method includes the following steps:

Step S10, after depositing a first metal layer and a gate insulation layer on a substrate, depositing an IGZO material on the gate insulation layer, and forming an IGZO film;

Step S11, performing a plasma cleaning treatment on a surface of the IGZO film by using an argon gas or a helium gas to adjust element contents on the surface of the IGZO film, for example, forming a certain amount of oxygen holes in the IGZO active layer in order to form an IGZO active layer.

Wherein, the step of performing a plasma cleaning treatment on a surface of the IGZO film by using an argon gas or a helium gas specifically includes:

performing a plasma cleaning treatment to a film surface of the IGZO active layer using the argon gas or the helium gas, wherein a power adopted in the plasma cleaning is 1000~6000 watts; a gas pressure is 30~70 mTorr, and a gas flow rate is 200~2000 standard milliliter/min; and a processing time is 0~120 seconds.

In a more specific example, the plasma cleaning treatment uses a power of 3000~4000 watts; a gas pressure of 30~50 mTorr; a gas flow rate of 500~1000 standard milliliter/min, and a processing time of 5~20 seconds.

It can be understood that, in some examples, the following steps are further included in the step S11:

photoresist coating, exposing, developing, and etching the surface of the IGZO film after the plasma cleaning treatment in order to complete an IGZO patterning to form the IGZO active layer.

It can be understood that performing the plasma cleaning treatment to the film surface of the IGZO active layer by the argon gas or the helium gas can adjust the content of each element of the film surface of the IGZO active layer, as shown in Table 2 below. In one embodiment, a schematic table of the change of each element after treating by the argon gas is shown.

| Peak | IGZO surface initially manufactured by PVD process without any treatment | IGZO surface treated with the Ar gas |
|---|---|---|
| Ga 2p | 12.53 | 26.12 |
| Zn 2p | 14.77 | 15.66 |
| O 1s | 56.98 | 43.53 |
| In 3d | 15.72 | 14.69 |

Wherein, the blank sample is IGZO film deposited by physical vapor deposition (PVD). After cleaning by the argon gas (Ar), a content percentage of Ga on the surface increases from 12.53 to 26.12, and a content percentage of Zn increases from 14.77 to 15.66, a content percentage of O decreased from 56.98 to 43.53, and a content percentage of In decreased from 15.72 to 14.69. Comparing to the data shown in Table 1 above, it can be known that the adjustment direction of film surface of the IGZO film after the argon gas or the helium gas treatment is opposite to the adjustment direction of the film surface of the IGZO film by the etching solution. Accordingly, treating the IGZO film by using the argon gas or the helium gas can improving the electrical performance of the IGZO active layer in a BCE type oxide thin film transistor.

Figure 3:
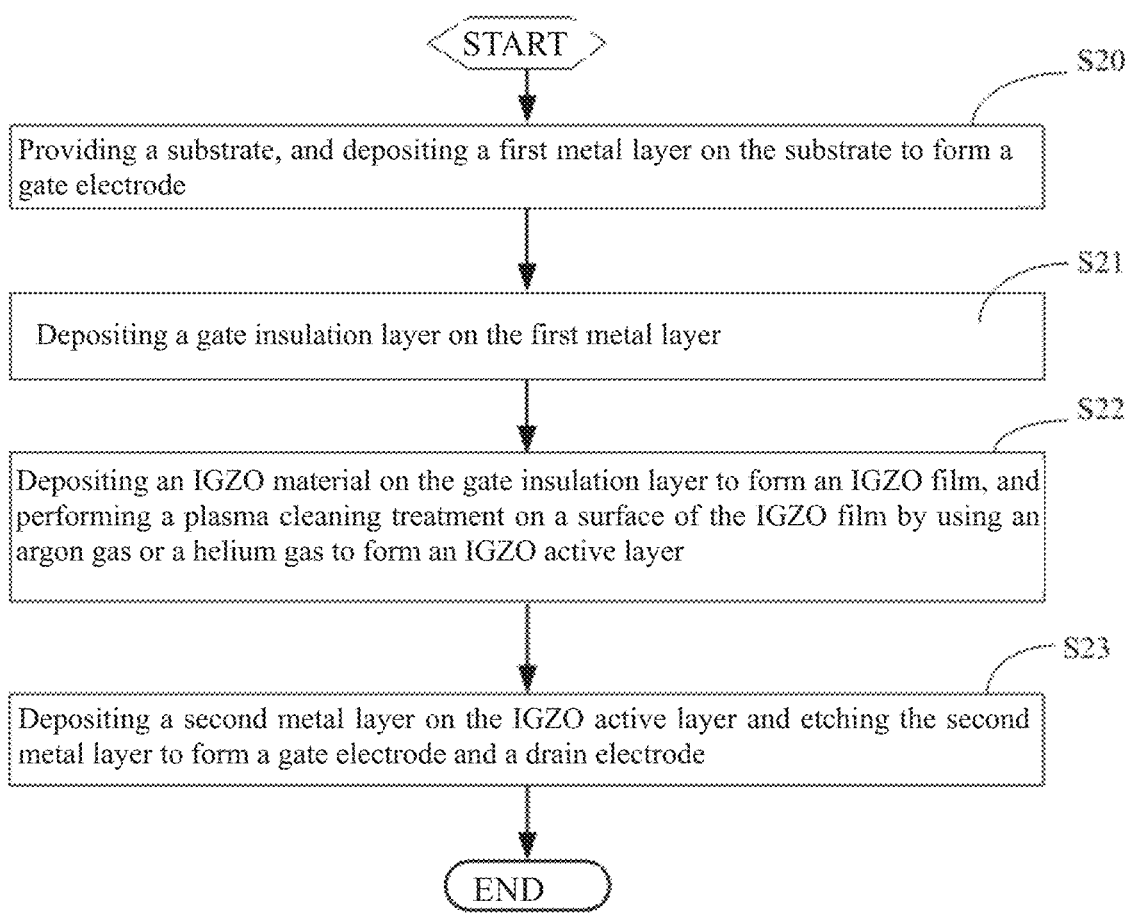
FIG. 3 is a schematic diagram of a main flow of a manufacturing method for an oxide thin film transistor provided by an embodiment of the present invention.

FIG. 3 is a schematic diagram of a main flow of a manufacturing method for an oxide thin film transistor provided by an embodiment of the present invention; in this embodiment, the method includes the following steps:

Step S20, providing a substrate, and depositing a first metal layer on the substrate to form a gate electrode;

Step S21, depositing a gate insulation layer on the first metal layer;

Step S22, depositing an IGZO material on the gate insulation layer to form an IGZO film, and performing a plasma cleaning treatment on a surface of the IGZO film by using an argon gas or a helium gas to form an IGZO active layer;

Wherein, the step of performing plasma cleaning treatment on a surface of the IGZO film by using an argon gas or a helium gas specifically includes:

performing a plasma cleaning treatment to a film surface of the IGZO active layer using the argon gas or the helium gas, wherein a power adopted in the plasma cleaning treatment is 1000~6000 watts; a gas pressure is 30~70 mTorr, and the gas flow rate is 200~2000 standard milliliter/min; a processing time is 0~120 seconds.

In a more specific example, the plasma cleaning treatment uses a power of 3000~4000 watts; a gas pressure of 30~50 mTorr; a gas flow rate of 500~1000 standard cc/min, and a processing time of 5~20 seconds.

Step S23, depositing a second metal layer on the IGZO active layer and etching the second metal layer to form a source electrode and a drain electrode.

Specifically; in an example; the step S22 specifically includes:

depositing an IGZO material on the gate insulation layer by physical vapor deposition to form the IGZO film;

performing the plasma cleaning treatment to the surface of the IGZO film by the argon gas or the helium gas;

photoresist coating, exposing, developing, and etching the surface of the IGZO film after performing the plasma cleaning treatment to the IGZO film in order to complete an IGZO patterning to form the IGZO active layer.

Specifically; in another example, the step S22 specifically includes:

depositing an IGZO material on the gate insulation layer by physical vapor deposition to form an IGZO film;

performing a plasma cleaning treatment to the surface of the IGZO film with an argon gas or a helium gas in order to form an IGZO active layer.

The step S23 is specifically:

depositing a second metal layer on the IGZO active layer;

coating a photoresist on the second metal layer;

etching a peripheral of the second metal layer and the IGZO film;

thinning the photoresist, and through a wet etching to form the source electrode and the drain electrode on the second metal layer.

In order to facilitate the understanding of the two examples referred to above, the following description will be respectively made with specific examples.

Figure 4:
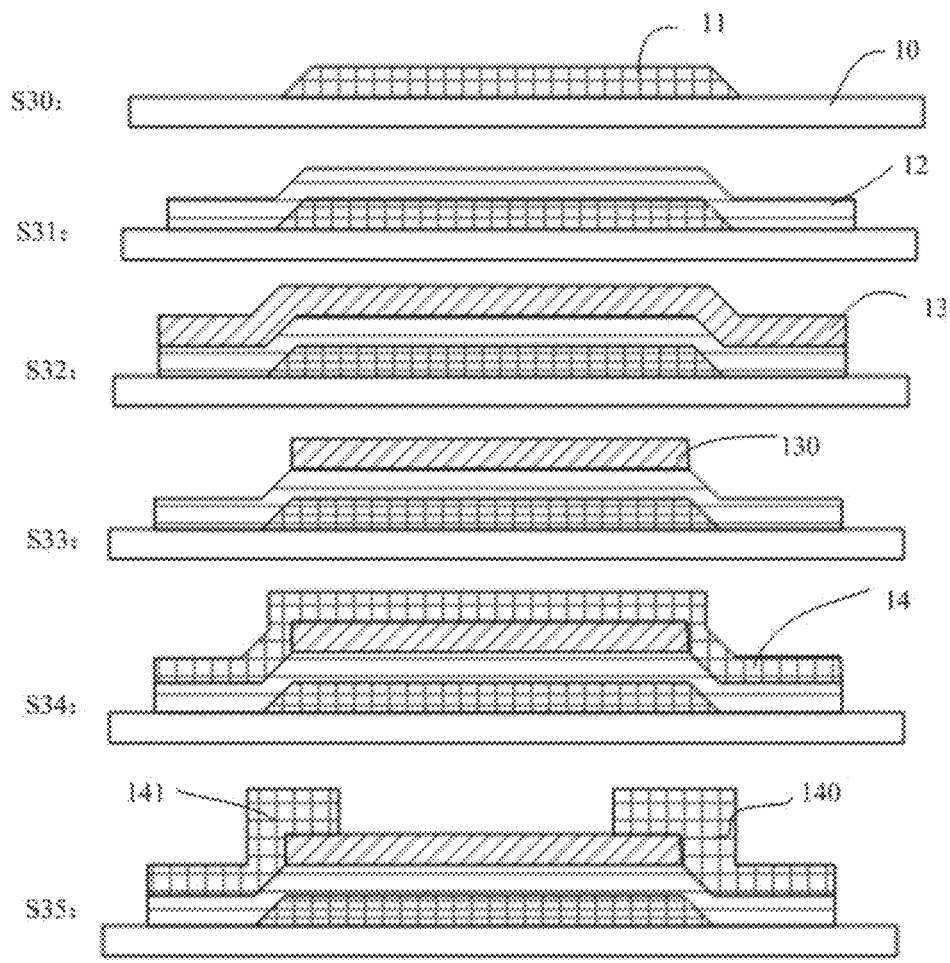
FIG. 4 is a schematic diagram showing more detailed steps of the manufacturing process corresponding to an embodiment of FIG. 3.

FIG. 4 is a schematic diagram showing more detailed steps of the manufacturing method corresponding to an embodiment of FIG. 3;

In the illustrated embodiment, a process for manufacturing an oxide thin film transistor using five masks is shown. Specifically, the following steps are included:

Step S30, forming a first metal, that is, depositing a first metal layer on a substrate 10 (such as a glass substrate) to form a gate electrode 11;

Step S31, depositing a gate insulation layer 12 on the gate electrode 11;

Step S32, depositing an IGZO material by physical vapor deposition (PVD) on the gate insulation layer 12 to form an IGZO film 13; at this time, the surface of the IGZO thin film needs to perform a plasma cleaning treatment with an argon gas or a helium gas, for specific processing conditions and methods, reference may be made to the foregoing description of FIG. 3;

Step S33, photoresist coating, exposing, developing, and etching the surface of the IGZO film after performing the plasma cleaning treatment to the IGZO film in order to complete an IGZO patterning to form an IGZO active layer 130;

Step S34, depositing a second metal layer 14 on the IGZO active layer 130;

In step S35, through a wet etching method, etching the second metal layer 14 to form a gate electrode 140 and a drain electrode 141.

Figure 5:
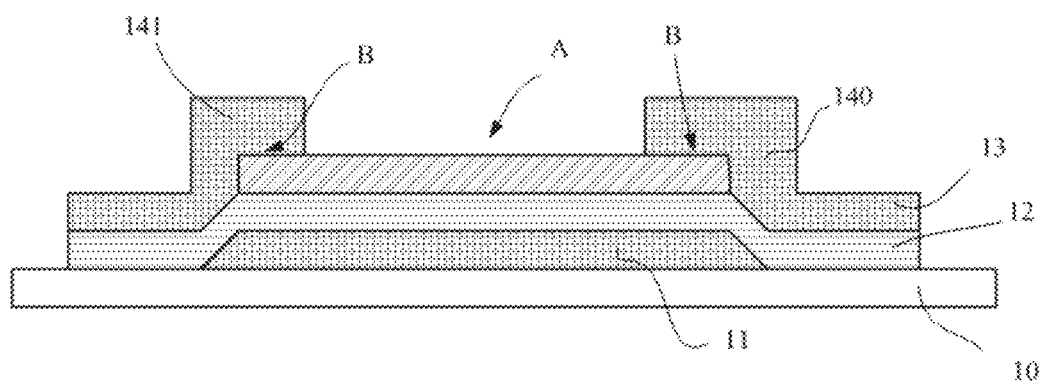
FIG. 5 is a schematic structural diagram of the finally formed oxide thin film transistor of FIG. 3.

The structure of the finally formed oxide thin film transistor is as shown in FIG. 5, wherein the IGZO film in the B region is treated only by the argon gas or the helium gas, and the conductivity of the IGZO film is improved, and the contact resistance is decreased; and the IGZO film in the A region is treated by the argon gas or the helium gas in advance, then, followed by etching through an etching solution; wherein the content of Ga, Zn, O and In elements is redistributed, which is beneficial to electrical improvement.

Figure 6:
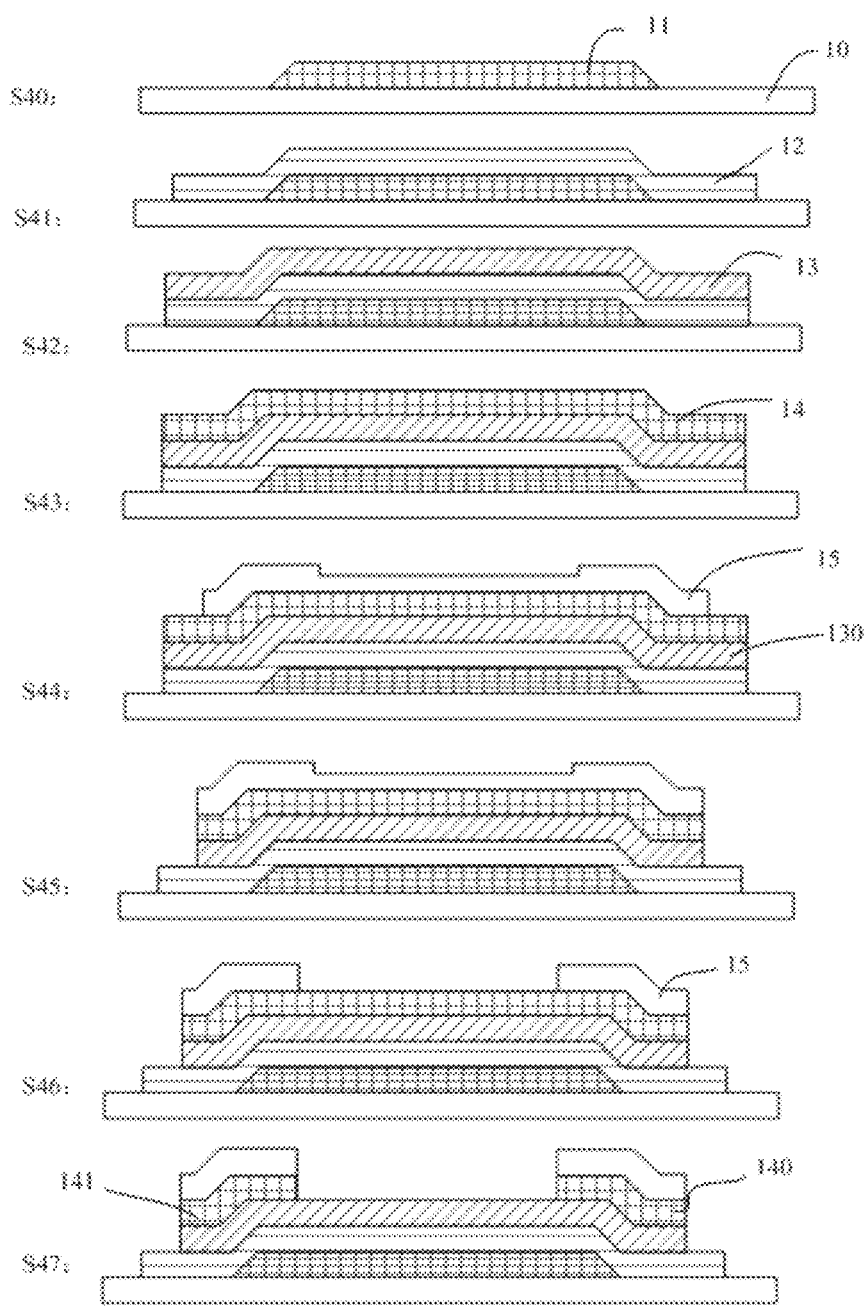
FIG. 6 is a schematic diagram showing more detailed steps of the manufacturing process corresponding to an embodiment of FIG. 3

FIG. 6 is a schematic diagram showing more detailed steps of the manufacturing method corresponding to another embodiment of FIG. 3;

Step S40, forming a first metal, that is, depositing a first metal layer on a substrate 10 (such as a glass substrate) to form a gate electrode 11;

Step S41, depositing a gate insulation layer 12 on the gate electrode 11;

Step S42, depositing an IGZO material by physical vapor deposition (PVD) on the gate insulation layer 12 to form an IGZO film 13; at this time, the surface of the IGZO thin film needs to perform a plasma cleaning treatment with an argon gas or a helium gas, for specific processing conditions and methods, reference may be made to the foregoing description of FIG. 3;

Step S43, depositing a second metal layer 14 on the IGZO film 13;

Step S44, coating a photoresist 15 on the second metal layer 14;

Step S45, etching a peripheral of the second metal layer 14 and the IGZO film 13 to form the IGZO active layer 130;

Step S46, thinning the photoresist 15 in the middle position to expose a part of the surface of the second metal layer 14;

In step S47, using a wet etching method to etch the second metal layer 14 in order to form the source electrode 140 and the drain electrode 141.

The structure of the finally formed oxide thin film transistor is as shown in FIG. 6, wherein, two terminals of the IGZO active layer 130 is treated only by the argon gas or the helium gas, the conductivity is improved, and the contact resistance is decreased; and the film layer in the middle position is treated by the argon gas or the helium gas in advance; and then; etching by the etching solution. The content of Ga, Zn, O and In elements is redistributed, which is beneficial to electrical improvement.

Embodiments of the present invention have the following beneficial effects:

The manufacturing method for an IGZO active layer and the manufacturing method for an oxide thin film transistor provided by the present invention, after forming an IGZO film, performing a plasma cleaning treatment on the surface of the IGZO film by using argon gas or helium gas such that the Ga content and the Zn content in the film surface of the IGZO active layer are increased, and the O content and the In content are decreased, thereby reducing the performance impact caused by the wet etching process for forming the source and drain electrodes.

It should be noted that, herein, relational terms such as first and second, and the like are only used to distinguish one entity or operation from another entity or operation. It is not required or implied that these entities or operations exist any such relationship or order between them. Moreover, the terms "comprise," include," or any other variation thereof, are intended to cover a non-exclusive inclusion, such that a series of elements including the process, method, article or device that includes not only those elements but also other elements not expressly listed or further comprising such process, method, article or device inherent elements. Without more constraints, by the statement "comprises one . . . " element defined does not exclude the existence of additional identical elements in the process, method, article, or apparatus.

The above description is only a specific embodiment of the present application, and it should be noted that those skilled in the art can also make some improvements and retouching without departing from the principle of the present application, should be considered as the protection scope of the present application.

What is claimed is:

1. A manufacturing method for an IGZO active layer, comprising steps of:

after depositing a first metal layer and a gate insulation layer on a substrate, depositing an IGZO material on the gate insulation layer, and forming an IGZO film; and performing a plasma cleaning treatment on a surface of the IGZO film by using an argon gas or a helium gas to adjust element contents on the surface of the IGZO film to form an IGZO active layer;

wherein the plasma cleaning treatment uses a power of 3000~4000 watts; a gas pressure of 30~50 mTorr; a gas flow rate of 500~1000 standard milliliter/min, and a processing time of 5~20 seconds.

2. The manufacturing method according to claim 1, wherein the method further includes a step of:

photoresist coating, exposing, developing, and etching the surface of the IGZO film after the plasma cleaning treatment in order to complete an IGZO patterning in order to form the IGZO active layer.

3. A manufacturing method for an oxide thin film transistor, comprising steps of:

providing a substrate, and depositing a first metal layer on the substrate to form a gate electrode;

depositing a gate insulation layer on the first metal layer;

depositing an IGZO material on the gate insulation layer to form an IGZO film, and performing a plasma cleaning treatment on a surface of the IGZO film by using an argon gas or a helium gas to form an IGZO active layer; and depositing a second metal layer on the IGZO active layer and etching the second metal layer to form a source electrode and a drain electrode;

wherein the step of performing plasma cleaning treatment on a surface of the IGZO film by using an argon gas or a helium gas includes a step of:

performing a plasma cleaning treatment to a film surface of the IGZO active layer using the argon gas or the helium gas, wherein a power adopted in the plasma cleaning treatment is 1000~6000 watts; a gas pressure is 30~70 mTorr, and the gas flow rate is 200~2000 standard milliliter/min; a processing time is 0~120 seconds.

4. The manufacturing method according to claim 3, wherein the step of depositing an IGZO material on the gate insulation layer to form an IGZO film, and performing a plasma cleaning treatment on a surface of the IGZO film by using an argon gas or a helium gas to form an IGZO active layer comprises steps of:

depositing an IGZO material on the gate insulation layer by physical vapor deposition to form the IGZO film;

performing the plasma cleaning treatment to the surface of the IGZO film by the argon gas or the helium gas; and photoresist coating, exposing, developing, and etching the surface of the IGZO film after performing the plasma cleaning treatment to the IGZO film in order to complete an IGZO patterning to form the IGZO active layer.

5. The manufacturing method according to claim 3, wherein the step of depositing an IGZO material on the gate insulation layer to form an IGZO film, and performing a plasma cleaning treatment on a surface of the IGZO film by using an argon gas or a helium gas to form an IGZO active layer comprises steps of:

depositing an IGZO material on the gate insulation layer by physical vapor deposition to form the IGZO film; and performing the plasma cleaning treatment to the surface of the IGZO film by the argon gas or the helium gas in order to form the IGZO active layer.

6. The manufacturing method according to claim 5, wherein the step of depositing a second metal layer on the IGZO active layer and etching the second metal layer to form a gate electrode and a drain electrode comprises steps of:
  depositing a second metal layer on the IGZO active layer;
  coating a photoresist on the second metal layer;
  etching a peripheral of the second metal layer and the IGZO film; and
  thinning the photoresist, and through a wet etching to form the gate electrode and the drain electrode on the second metal layer.

* * * * *